United States Patent
Sharma

(10) Patent No.: US 8,415,255 B2
(45) Date of Patent: Apr. 9, 2013

(54) PORE SEALING AND CLEANING POROUS LOW DIELECTRIC CONSTANT STRUCTURES

(75) Inventor: Balgovind Sharma, Fishkill, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/063,010

(22) PCT Filed: Aug. 5, 2005

(86) PCT No.: PCT/EP2005/010048
§ 371 (c)(1),
(2), (4) Date: Feb. 5, 2008

(87) PCT Pub. No.: WO2007/016968
PCT Pub. Date: Feb. 15, 2007

(65) Prior Publication Data
US 2008/0311752 A1 Dec. 18, 2008

(51) Int. Cl.
*H01L 21/469* (2006.01)

(52) U.S. Cl.
USPC .............. 438/756; 438/745; 216/37; 216/41; 510/175; 510/407; 510/412; 510/413; 510/505

(58) Field of Classification Search .................. 438/756, 438/745; 216/37, 41; 510/175, 407, 412, 510/413, 505
See application file for complete search history.

(56) References Cited

U.S. PATENT DOCUMENTS

| 7,560,165 B2 * | 7/2009 | Kloster et al. ............... 428/447 |
| 2002/0013239 A1 * | 1/2002 | Sahbari ........................ 510/175 |
| 2002/0195128 A1 * | 12/2002 | Shibagaki ....................... 134/26 |
| 2004/0058626 A1 * | 3/2004 | Filipozzi et al. ................ 451/57 |

FOREIGN PATENT DOCUMENTS

| WO | 2005008739 A2 | 1/2005 |
| WO | 2005081289 A2 | 9/2005 |

* cited by examiner

*Primary Examiner* — Nadine G Norton
*Assistant Examiner* — Maki Angadi

(57) ABSTRACT

A micellar solution is used to seal pores exposed at the bottom and sidewall surfaces of a structure etched in or through a porous low dielectric constant material. The micellar solution is also effective to clean away etch residues from the etched structure.

20 Claims, 5 Drawing Sheets

PORE SEALING AND CLEANING POROUS LOW DIELECTRIC CONSTANT STRUCTURES

FIELD OF THE DISCLOSURE

The present invention relates to the field of integrated circuit fabrication. More particularly, the invention relates to pore sealing and cleaning of structures etched in porous low dielectric constant (low-k) structures.

BACKGROUND

It is to be understood that in the present document (unless the context requires otherwise) references to porous "low dielectric constant" (or "low-k") structures denote structures in porous materials having a dielectric constant lower than about 3.0. Thus, these references encompass structures etched in porous so-called "ultra-low-k" (ULK) materials (having $k \leq 2.5$).

The fabrication of integrated circuits typically includes one or more steps involving the etching of vias, trenches and the like, especially during back-end-of-line (BEOL) processing. These etching processes generally leave residues at the bottom and on the sidewalls of the etched structures. The residues are often organo-metallic polymers containing species such as C, O, F, Si, Cu, H and N. The presence of these residues contributes to problems such as low yield, high via resistance, via voids and reliability problems. Thus, fabrication processes include a post-etch cleaning step designed to remove these residues.

Conventionally, wet cleaning techniques are used to remove such residual polymers, notably by the application of aqueous solutions, such as dilute hydrofluoric acid (HF), or organic acids/bases.

More recently, complex multi-component solvent systems (including components such as corrosion inhibitors, chelating agents, fluorine, amines and other chemical compounds) have been developed for use as post-via-etch cleaning formulations targeted at the particular processing residues formed in specific fabrication lines. Furthermore, WO2005/008739 proposes use of aqueous micellar solutions for cleaning non-porous low-k dielectric materials, reasoning that the low chemical reactivity of such solutions will leave k values of the dielectric layers unaffected.

Now, low-k and ultra-low-k dielectric materials are becoming employed to an increasing extent in integrated circuit devices. Many of these materials are porous in order to achieve the desired low value of dielectric constant. Indeed, often a known low-k dielectric material has porosity introduced therein in order to reduce its dielectric constant yet further.

Some porous low-k dielectric materials that have recently been proposed include porous materials deposited by chemical vapour deposition (CVD) processes: such as later versions of Black Diamond (namely Black Diamond II and III, porous low-k SiCOH) made by Applied Materials Inc. of California, USA, and Orion made by Trikon Technologies Inc of Newport, UK; and spin-on dielectric materials: such as p-SiLK (the porous version of SiLK) made by Dow Chemicals, Zirkon LK (porous methyl silsesquioxane) made by Rohm and Haas' subsidiary Shipley, LKD-5109 made by JSR Corp of Japan and Aurora 2.7 and Aurora ULK (carbon-doped silicon oxide) made by ASM International NV of Bilthoven, Netherlands.

However, when an etched structure is formed in a porous material, many conventional post-via-etch wet cleaning approaches have been found to give undesirable results. More particularly, when the conventional approach is used for post-via-etch wet cleaning of, for example, a wafer bearing a porous interconnect layer, the porous dielectric material has been found to adsorb chemicals and liquids (such as water) from the cleaning fluids, leading to an undesired increase in the dielectric constant. The reason for this problem is explained below.

Any silicon oxide-containing material will have a substantial population of surface hydroxyl (silanol) groups on the surface, which are highly polarized and therefore have a high affinity to water uptake. These sites are generated by the break up of four and six member bulk siloxane (Si—O—Si) bridges at the surface of the material. These siloxane structures at the material surface have an uncompensated electric potential and so can be considered to be "strained". They will react with moisture to form surface hydroxyl groups. When the material is porous, the surface hydroxyls and the adsorbed water molecule will propagate to the bulk of the material. This may result in increased dielectric constant values and reduced reliability of the film. Similar adsorption mechanisms operate for the chemicals present in wet cleaning fluids. In addition, the chemicals can remain strongly adsorbed within the porous structure, resulting in an increase in K value.

A comparable effect occurs for other materials, such as metal oxides, present on the surface of a wafer. The metal ion-oxide bonds located at the surface of the material have an uncompensated electric potential. This leads to a tendency to react with moisture so as to form surface hydroxyl groups. Once again, if the material is porous the surface hydroxyls and adsorbed water molecule will propagate to the bulk of the material and lead to an unwanted increase in dielectric constant. Once again, similar adsorption mechanisms lead to the take-up of chemicals from the wet cleaning fluid, which can be more severe than water intake as chemicals cannot be removed by drying whereas water can (at least to some extent).

For example, tests have been conducted using a sample made of the above-mentioned porous ULK material LKD-5109, having dielectric constant k 2.25. When structures are etched in this sample and cleaned with known cleaning liquids then it has been found that the dielectric constant of the sample increases disadvantageously, primarily because chemicals penetrate the pores and cause an increase in K value. For example, using aqueous-based cleaning liquid Deerclean (or LK1) from Kanto Corporation it was found that the dielectric constant increases to 2.4; using solvent-based cleaning liquid ESC 760 manufactured by ATMI, dielectric constant increases to 2.6; using solvent-based cleaning liquid ST-250, manufactured by ATMI, dielectric constant increases to 2.9; using solvent-based cleaning liquid CLk 870 or CLk 888, manufactured by Malinckrodt Baker Inc., dielectric constant increases to 2.8.

The problem of take-up of chemicals into the porous dielectric layer is particularly acute in the case where the porous dielectric has undergone plasma damage during the via/trench-etching process. In addition to the negative effect on the porous dielectric layer's dielectric constant, the adsorbed chemical and moisture can also cause problems during subsequent stages in the manufacture of the circuit, notably degassing and reliability problems.

In view of the above-mentioned problems, some proposals have been made to counteract the liquid uptake by the porous dielectric material that occurs during post-etch wet cleaning.

According to one such proposal, after the etching step a separate process is applied in order to seal the exposed pores in the porous material before application of post-etch cleaning liquids. However it has been found that, after cleaning such pore-sealed dielectric layers using conventional cleaning fluids there has still been undesirable water adsorption by the dielectric layer. Moreover, such an approach has the disadvantage of adding a step to the fabrication process, increasing fabrication time and costs.

Another recent proposal of this type, in EP-A-1,511,072, involves annealing the porous layer after the post-etch cleaning step, so as to drive off the liquid components that have penetrated into the porous material. However, this proposal also has the disadvantage of increasing the number of steps involved in the fabrication process.

In view of the above results, up to now it has been believed that wet cleaning techniques are unsuitable for use in cleaning structures etched in porous materials or, at the least, they need to be combined with an additional process to counteract the ingress of liquid into the porous material.

An alternative "dry" cleaning technique has been proposed for post-via-etch cleaning of a wafer bearing a porous dielectric material. This approach involves applying supercritical carbon dioxide ($CO_2$) to the etched surface. However, this approach has the disadvantage that it requires investment in new equipment which is at a more experimental stage in development than the cleaning equipment already in widespread use in the semiconductor manufacturing industry.

There is a need for an improved technique for treatment of structures etched in porous low-k materials.

SUMMARY

The present invention provides a method for sealing pores exposed in structures etched in a porous dielectric material as claimed in the accompanying claims.

The present invention further provides pore-sealing apparatus treating structures etched in a porous material as claimed in the accompanying claims.

The present invention provides a semiconductor device manufacturing method as claimed in the accompanying claims.

The preferred embodiments of the present invention provide a processing technique that both seals pores at the surface of structures etched in a porous dielectric material and cleans away residues left in those etch structures. This technique cleans the residues from the etched structures, whilst maintaining the desired low-k of the porous material without needing a separate pore-sealing step before the etched structures are cleaned, or an annealing step after the etched structures are cleaned.

BRIEF DESCRIPTION OF DRAWINGS

The above and other features, advantages and particularities of the present invention will become more apparent from the following description of preferred embodiments thereof, given by way of example, illustrated by the accompanying drawings, in which.

DETAILED DESCRIPTION

The present inventor has discovered that, in certain circumstances, post-etch wet cleaning does not lead to take up of liquid by a porous low-k dielectric material. In particular, the pores in the porous low-k dielectric material can be sealed, and etch residues removed, by applying a micellar solution to the etched structure. The micelles effectively block the pores at the surface of the etched structure, preventing subsequent ingress of water and/or chemicals to the interior of the porous dielectric material. Moreover, the micellar solution can also be effective to remove residues from the etched structure.

Micelles are electrically-charged colloidal particles, usually organic in nature, that are composed of aggregates of large surfactant molecules. It will be recalled that surfactants are substances that lower the interfacial tension between two phases (e.g. gas and liquid, liquid and liquid, liquid and solid). Surfactants are amphiphilic molecules having a strongly polar head that is hydrophilic, and a non-polar tail that is hydrophobic. If the head is charged then the surfactant is said to be ionic, if the head is not charged then the surfactant is said to be non-ionic.

In surfactant solutions having appropriate pH, temperature, water content and electrolyte composition, surfactant molecules assemble themselves into micelles when the concentration of surfactant in the solution exceeds a certain level called the Critical Micelle Concentration (CMC). Cationic surfactants, non-ionic surfactants, zwitterionic surfactants, and anionic surfactants can all form micelles and can all be used in embodiments of the present invention.

Figure 1:
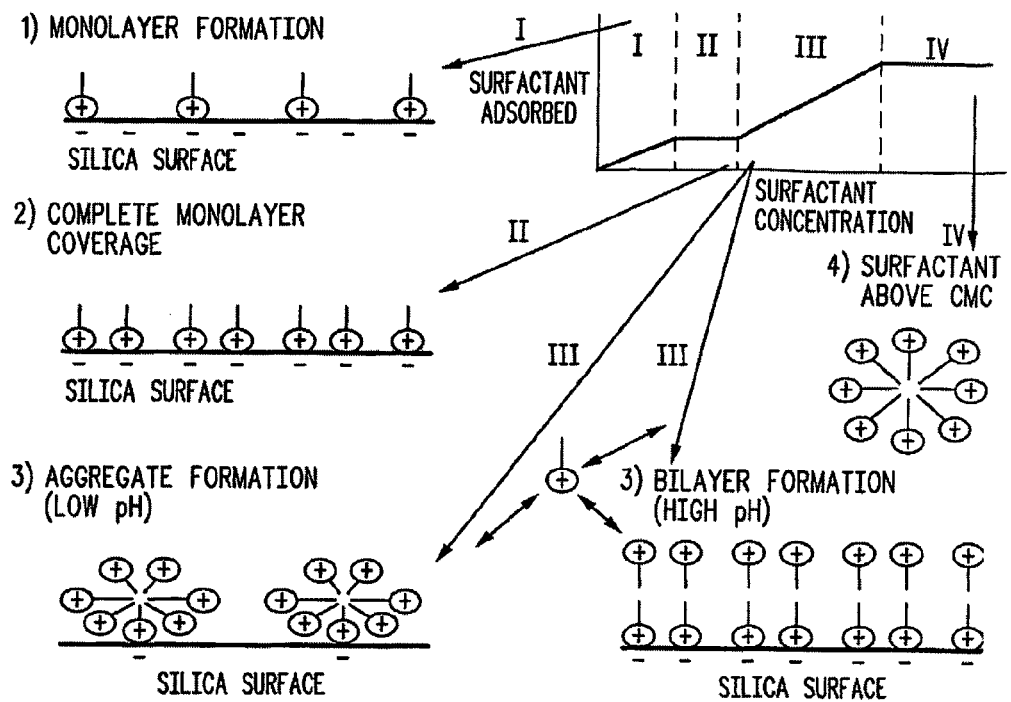
FIG. 1 is a phase diagram (or adsorption isotherm) illustrating the various structures that surfactants can assume in solution as surfactant concentration changes.

The significance of the CMC can be appreciated from FIG. 1, which is a phase diagram (or Adsorption Isotherm) illustrating how the behaviour of a surfactant changes as the concentration thereof varies. In the example illustrated in FIG. 1, the surfactant is a typical cationic surfactant in the presence of a silica surface. Anionic and non-ionic surfactants also show similar adsorption isotherms. Moreover, the shape of the surfactant adsorption is the same on other surfaces besides silica (whether positively charged materials, such as alumina, or uncharged materials, such as graphite).

As shown in FIG. 1, when the concentration of the surfactant in the solution is low (REGION I in FIG. 1), the surfactant is adsorbed sparsely onto the silica surface, with the cationic portion of the surfactant adhering to the negatively charged silica surface and the non-ionic tail of the surfactant extending into the solution.

As the concentration of surfactant increases, as illustrated in REGION II of FIG. 1, the surfactant is adsorbed more evenly across the silica substrate to form a mono-layer. However, as in the case in REGION I, the cationic portion of the surfactant adheres to the negatively-charged silica surface, and the non-ionic tail of the surfactant extends into the solution.

As illustrated by REGION III of FIG. 1, as the concentration of surfactant increases still further, the surfactant begins to adopt more complicated structures. Depending on the pH of the solution, the surfactant may adopt aggregate formations (for low pH solutions) or bilayer formations (for high pH solutions). In both types of formations, the structure remains anchored to the silica substrate by way of the cationic heads of the surfactant.

Figure 2:
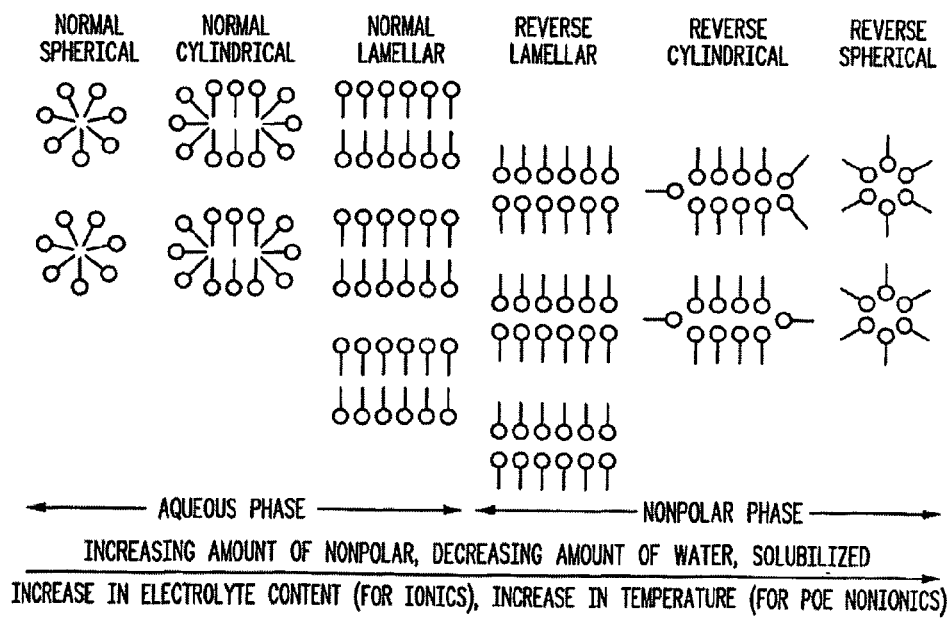
FIG. 2 illustrates some of the micellar structures that surfactants can assume in solution.

Finally as illustrated in REGION IV of FIG. 1, when the surfactant concentration exceeds the CMC, the surfactant forms micellar solutions, in which the surfactant molecules assemble into free-floating aggregates. These free-floating aggregates, termed "micelles", may be made to assume a number of different configurations, including normal spherical, normal cylindrical, normal lamellar, reverse lamellar, reverse cylindrical, and reverse spherical configurations. These different micelle configurations are illustrated in FIG. 2. The particular configuration assumed by the micelle depends on such factors as the nature of the solvent the surfactant is in (e.g. whether the surfactant is in an aqueous or other polar solvent, or in a non-polar solvent), the temperature of the solution, the chemistry of the surfactant, and the amount of electrolyte in the solution.

In the present document the expression "micelle" is used irrespective of the configuration of the aggregate in question and, in particular, does not necessarily imply that the aggregate is spherical. Moreover, the expression "micellar solution" is used to denote any solution containing such micelles (i.e. irrespective of the configuration—spherical, lamellar, etc.—of the aggregate present in the solution).

The present inventor has discovered that when a structure etched in a porous low-k material is exposed to a suitable micellar solution, liquid from the solution does not, in fact, penetrate into the porous material. The reason for this will now be explained with reference to FIG. 3.

Figure 3:
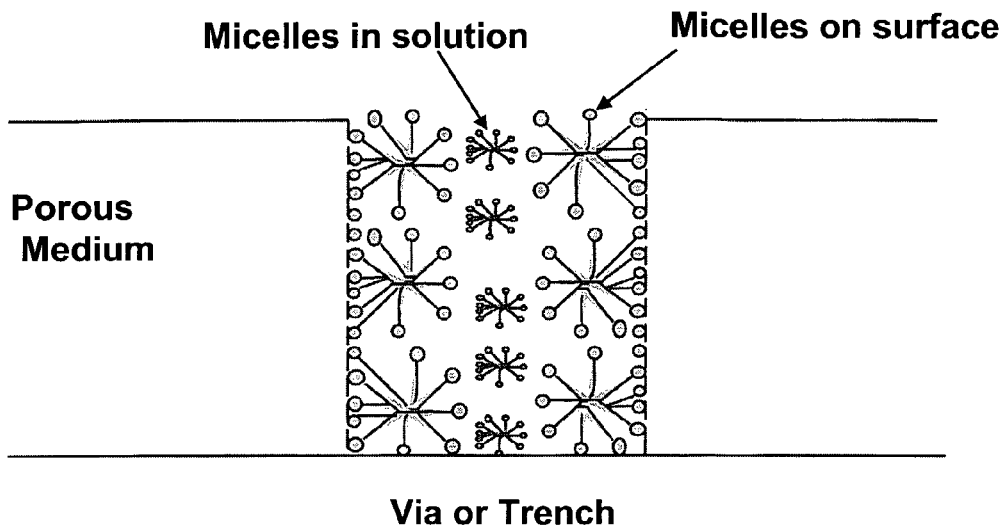
FIG. 3 is a diagram illustrating how micelles serve to seal pores at the surface of a structure etched in a porous low-k material.

The average diameter of a pore in a typical porous low-k dielectric material is around 0.8 nm (8 Å), sometimes down to around 0.1 nm (1 Å) for ULK materials. By way of contrast, the average diameter of a typical micelle is around 2.5 to 5.0 nm (25 to 50 Å) depending upon the surfactant. When a micellar solution comes into contact with the surface of a porous low-k dielectric material (e.g. exposed at the sidewalls and/or bottom of an etched structure), the hydrophilic or polar head of the micelles is attracted to the exposed charged surface of the porous dielectric material because of the uncompensated electric potential at the surface of the porous material. If the exposed dielectric surface is hydrophobic or without charge, the hydrophobic tails are attracted to the dielectric surfaces forming either reverse micelles (cationic or anionic) or regular micelles (non-ionic). However, the micelles are too large to penetrate into the interior of the porous material. Instead they become attached to the exposed surface, and physically block access to the pores by other molecules in the micellar solution, as illustrated in FIG. 3. (Incidentally, in FIG. 3 the size of the micelles attached to the surface is exaggerated compared to the size of the micelles still in solution, for the purposes of illustrating the micelles' pore-sealing capability).

Thus, application of a micellar solution to a structure etched in a porous low-k dielectric material serves to seal pores in the porous dielectric material. Moreover, application of the micellar solution can also serve to solubilize post-etch-residues, facilitating their removal.

Figure 4:
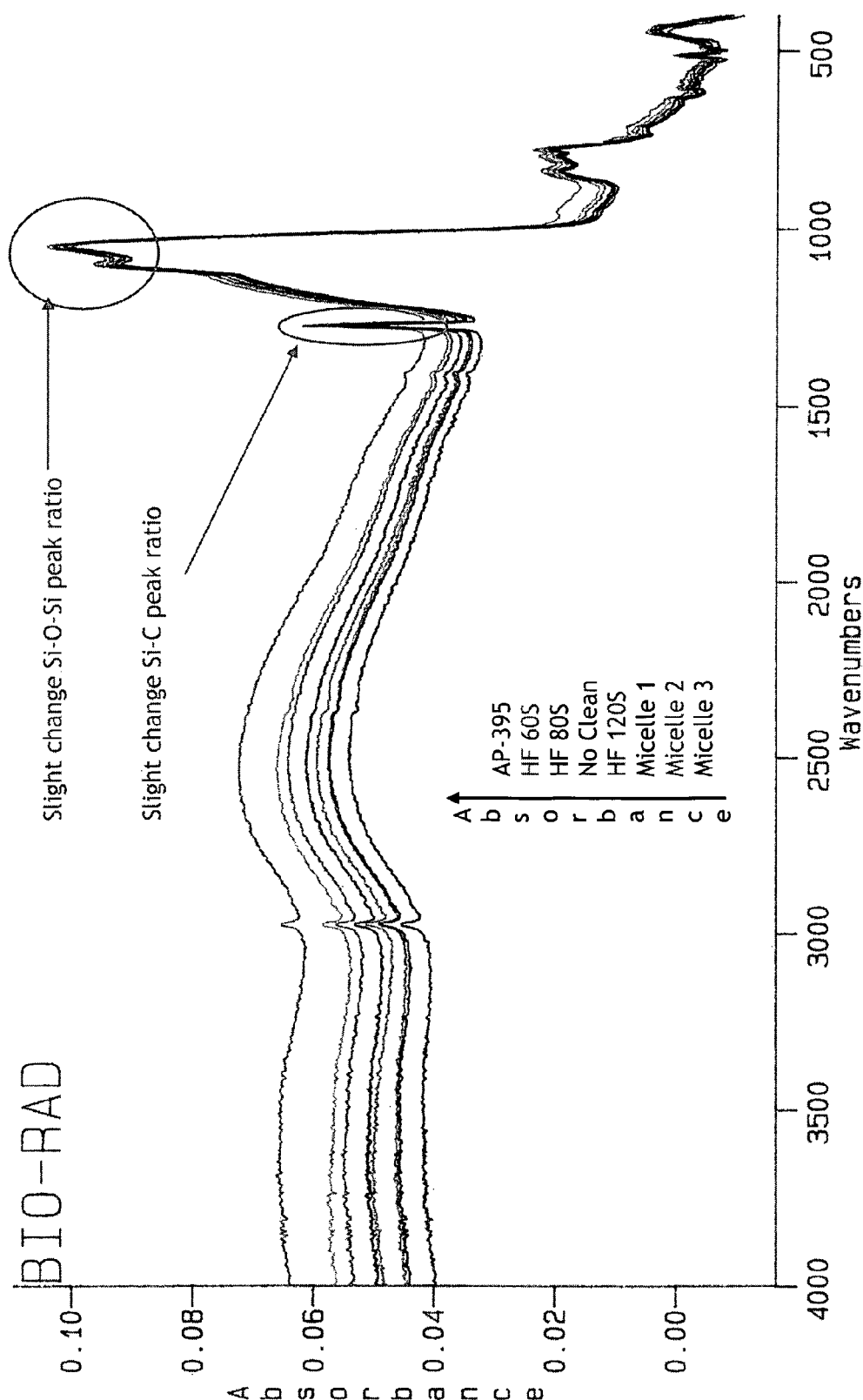
FIG. 4 is a graph showing absorbance spectra, notably Fourier Transform Infra-Red spectra (FTIR spectra), for a sample of LKD-5109 porous ultra low-k material after cleaning according to different cleaning regimes.

The pore sealing effect achieved by applying micellar solutions according to the present invention can be seen from the graph of FIG. 4. FIG. 4 shows the absorbance of different samples of a film of LKD-5109 ULK dielectric material that have been subjected to respective different cleaning regimes.

Most of the conventional cleaning regimes (such as solvent AP-395 cleaning agent produced by ATMI) result in an increase in the absorbance spectra of the porous low-k material (compared to the case where no cleaning is performed), indicative of structural change. Cleaning with three different micellar solutions did not show any structural change, as can be noted in the Figure. Dielectric constant remained constant for all three micellar solution cleans, but increased with AP395 cleaning due to chemical adsorption and, perhaps, structural changes.

However, it can be seen from FIG. 4 that all three samples that have been treated with micellar solutions according to the present invention have absorbance that is similar to the uncleaned sample. As the concentration of surfactant is low (0.1%) in micellar solutions, minimal structural change of porous dielectric can be expected with such treatments.

The first micellar solution (Micelle 1) is an aqueous solution containing a cationic surfactant, namely a quaternary ammonium compound present at a concentration above the CMC (0.05 to 0.1 wt % of surfactant compared to the total weight of the solution). The second micellar solution (Micelle 2) is an aqueous solution of a non-ionic surfactant, namely telomer B monoether with polyethylene glycol (the surfactant being present in an amount of 0.05 to 0.1 wt %). The third micellar solution (Micelle 3) is an aqueous solution of fluoroalkyl alcohol substituted polyethylene glycol (a standard surfactant supplied by Du Pont), the surfactant being present in an amount of 0.05 to 0.1 wt %.

A wide variety of micellar solutions are suitable for use in the present invention. These solutions will contain at least one surfactant present at a concentration above its respective critical micelle concentration, as well as a solvent: the solvent may be water and/or an oil phase and/or an alternative solvent. In addition, they may contain one or more of the following: an added electrolyte (to supply additional counter-ions), a co-surfactant (to improve solubility), a co-solvent and other additional components.

With regard to the micelle-forming surfactant that can be used in the micellar solutions employed in the present invention, this can be a cationic surfactant, an anionic surfactant, a zwitterionic surfactant, or a non-ionic surfactant. Moreover, so-called "mixed micellar solutions", in which more than one surfactant is present and contributes to micelle formation, can be used (whether each surfactant in the solution forms a separate type of micelle or contributes to a mixed micelle). In all these cases, the important factor is that the micelles present in the micellar solution should be sufficiently large to provide effective steric shielding of the pores in the porous low-k material in question. Having regard to the effectiveness of the steric shielding, it is preferred that the micelle diameter should be at least equal to about 1.5 to 2 times the diameter of the pores in the porous material.

Table 1 below gives a non-exhaustive list of some of the families of chemical compounds that can be used in embodiments of the present invention.

TABLE 1

Examples of Surfactants Useable in the Invention

| Type | Family and Examples | Example Details |
|---|---|---|
| anionic | carboxylic acids and salts of carboxylic acid | soaps; straight chain fatty acids; triglycerides; sodium dodecanoate; sodium laurate (i.e. sodium n-dodecanoate, n typically from about 8 to about 22); sodium octanoate; sodium oleate; sodium erucate; potassium dodecanoate; potassium octanoate; etc. |
| | amines and salts of amines or other amine derivatives | triethanolamine salts; lauryl dimethylamine oxide, (LDAO); etc. |
| | sulfonic acid salts | linear and higher chain alkylbenzene sulfonates-LAS; ligninsulfonates; petroleum sulfonates and other sulfonates; sulfonate ester; etc. |
| | sulfuric acid ester salts | sulfated primary and polyoxyethylenated alcohols; sulfated triglycerides; etc. |
| | n-alkyl sulfates | sodium n-dodecyl sulfate (NaLS) (n typically from about 8 to about 22); sodium dodecyl sulfate (SDS), i.e. $CH_3(CH_2)_{11}OSO_3Na$; etc. |
| | block copolymers | polystyrene-block-poly(2-vinylpyridine), in toluene solvent |
| | crown ethers and their derivatives | octyl-18-crown-6; decycloxymethyl-15-C-5; etc. |
| | phosphoric acid esters | phosphated polyoxyethylenated alcohols and phenol (POE); etc. |
| | perfluorinated compounds | perfluorocarboxylic acids; etc. |
| | dialkyl maleates anionic fluorosurfactants | Zonyl ® FS-62; Zonyl ® 9361; Zonyl ® FSJ; Zonyl ® FSP; and Zonyl ® FSA made by E.I. du Pont de Nemours; etc. |
| | dioctyl sulfosuccinates | Triton GR series surfactants made by Dow Surfactants; etc. |
| cationic | long chain amines and their salts diamines and polamines, and their salts | primary amines; etc. |
| | quaternary ammonium compounds (halides, salts, etc.) | tetraalkyl ammonium halides (e.g. cetyl trimethylammonium bromide, CTAB; cetyl trimethylammonium chloride, CTAC; hexadecyl trimethylammonium bromide, C16TAB; n-hexadecyl trimethylammonium bromide; dodecyl trimethylammonium bromide, DTAB or C12TAB; n-dodecyl trimethylammonium bromide; tetradecyl trimethylammonium bromide TTAB; etc.); benzyl alkyl ammonium halides; cetyl pyridinium chloride; sulfates (e.g. tetramethylammonium dodecylsulfate, TMAOS; imidazolinium or pyridinium salts containing sulfates; etc.); tris (2-hydroxyethyl) tallowalkyl ammonium acetate, TTAA; etc. |
| | perfluoro quaternary ammoniumcompounds | perfluoroethyl trimethyl ammonium acetate; etc. |
| | polyoxyethylenated (POE) long-chain amines | POE Amines (e.g. polyethoxylated tallow amine, POEA); etc. |
| | silanes | octadecyl trichlorosilane (OTS); etc. |
| | dialkyl maleates polyethers | poly(oxyethylene (4) lauryl ether); etc. |
| | salts of diesters of sulfosuccinic acid | sodium bis(2-ethylhexyl) sulfosuccinate, AOT; etc. |
| | alkyl glucosides and alkyl polyglucosides | linear octyl β-glucoside; n-octyl-β-D-glucoside; linear octyl α-glucoside; branched octyl α-glucoside (e.g. 2-ethylhexyl α-glucoside); decyl maltoside; dodecyl-β-D-maltoside; 6-cyclohexylhexyl-β-D-maltoside: etc. |
| non-ionic | quaternized polyoxyethylenated (POE) long-chain amines | POE Amines; etc. |
| | amine oxides alkylphenol derivatives (ethoxylates, etc.) | alkyldimethylamine oxides polyoxyethylenated phenols (POE) (e.g. nonylphenol poly(ethyleneoxide), NPEO10); octyl phenol ethoxylates (e.g. alkyl-cyclohexyl-O-polyethyleneglycol, Triton X-100 made by Dow Surfactants); etc. |
| | n-alkyl poly(ethyleneoxide) ethers - where n is typically from about 8 to about 12 and the poly(ethylene oxide) chain is typically 6 to 8 carbon atoms in length | hexaethylene glycol monododecyl ether ($C_{12}E_6$); polyoxyethylene 10-lauryl ether (Brij); etc. |
| | polyoxyethylenated ethoxylates alcohols | POE alcohols |
| | polyoxyethylenated polyoxypropylene glycols | POE glycols |
| | polyoxyethylenated mercaptans | POE mercaptans |
| | ethyleneoxide-polypropyleneoxide-ethyleneoxide block co-polymers (EO-PO-EO block co-polymers) | 15 ethyleneoxide-polypropyleneoxide-ethyleneoxide block co-polymer; etc. |
| | non-ionic fluorosurfactants | Zonyl ® FS-100; Zonyl ® FSH; Zonyl ® FSN made by E.I. du Pont de Nemours; etc |
| | long chain carboxylic acid esters | glycerol, esters of fatty acids; propylene glycol ester; polyoxyethylene glycol and fatty acid ester; etc. |
| | alkanolamides | alkanolamine fatty acid; acetylenic glycol; etc. |
| | polyoxyethylenated silicones | |
| | n-alkylpyrrolidones | vinyl pyrrolidone; etc. |
| | alkyl glucopyranosides | n-octyl-β-D-glucopyranoside; hexyl-β-D-glucopyranoside; nonyl-β-D-glucopyranoside; etc. |
| | phosphate esters | Triton QS-44 made by Dow Surfactants |
| zwitterionic | alkylaminopropionic acids | n-alkyl-B-iminodipropionic acid; etc. |
| | imidazoline carboxylates | |
| | n-alkylbetaines | dodecyl betaine; etc. |
| | amine oxides | dodecyl dimethylamine oxide; etc. |
| | other amine salts and derivatives | n-dodecyl-N,N-dimethylamino acetate; etc. |
| | sulfobetaines | |
| | n-alkyl sulfonates | 3-(N,N-dimethyl hexadecyl ammonium)-propanesulfonate (PAPS); N-dodecyl-N,N-dimethyl-3-ammonio-1-propanesulfonate (DAPS); etc. |
| | dialkyl maleates | |

TABLE 1-continued

Examples of Surfactants Useable in the Invention

| Type | Family and Examples | Example Details |
|---|---|---|
| cationic or zwitterionic (dependent on pH) | certain salts of di-esters of sulfosuccinic acid | n-(2-hydroxydodecyl) sarcosinate |

It is to be understood that other micellar solutions, besides those listed in Table 1, may be suitable for use in the techniques of the present invention. Moreover, if the micelles normally formed by a given surfactant are too small to provide effective steric shielding for a particular porous material, the given surfactant can still be used in a micellar solution according to the present invention for sealing exposed pores of that particular porous material by taking measures to increase the micellar diameter in that solution—namely by appropriate addition of co-surfactant, co-solvent and/or electrolyte. The skilled person knows how micelle diameter can be varied by addition of co-surfactant, co-solvent and electrolyte and so no further detail will be given here.

A micellar solution employed in the present invention will typically include one surfactant present at a concentration above the CMC so that it forms free-floating micelles. Another surfactant may be present in the micellar solution at a concentration below its CMC, for example so as to act as a co-solvent or cosurfactant. Alternatively, as indicated above the micellar solution may be a so-called mixed micellar solution containing more than one surfactant, each present at a concentration suitable to contribute to formation of micelles. In some cases non-ionic surfactants may be less hazardous to the environment and so may be preferred in certain applications.

The solvent used in the micellar solution will most often be water. However, other solvents can also be employed as explained in subsequent paragraphs. Aqueous micellar solutions used in the present invention can include one or more co-solvents selected in the (non-exhaustive) list that follows: ethers, alkyl-substituted ethers (such as ethylene glycol monobutyl ether, EGMBE), alcohols, amines, amides, carboxylic acids, polyethers, polyols, polyamines, or polyamides. The amount of the co-solvent may vary and may depend, in part, on the chemistry of the micellar solution. Typically, the amount of co-solvent present in the micellar solution is within the range of about 1% to 10% by weight (compared to the total weight of the solution).

Other polar solvents instead of water can be employed in the micellar solutions used in the present invention depending upon the nature of the surfactant to be used for micelle-formation. For example, water-miscible hydroxyl compounds, hydrocarbons, alcohols (e.g. methanol, ethanol, isopropanol, pentanol, 1-butanol, etc.), glycols, carboxylic acids (such as acetic, citric, oxalic, tartaric, malic, glycolic, terephthalic, phthalic, salicyclic acids, and others), etc. Appropriate co-solvents may be added as desired, for example in order to increase surfactant solubility in these other polar solvents.

Moreover, non-polar solvents can be employed in the micellar solutions used in the present invention depending upon the nature of the surfactant to be used for micelle-formation: e.g. urea, formamide, amides, n-methylacetamide, guanidinium salts, higher chain alcohols (such as decanol), esters, dioxane, ethylene glycol, polyhydric alcohols such as fructose or xylose, etc. Appropriate co-solvents may be added as desired, for example in order to cause the formation of reverse micelles, or when the surface on which the micelles are to bond is hydrophobic.

The concentration of the surfactant(s) contributing to micelle formation in the micellar solutions used in the present invention may vary. Typically the micelle-forming surfactant will be present in the solution at a concentration of less than about 5% by weight (compared to the total weight of the solution).

Most surfactants form micelles at concentrations from about 0.05-0.1% by weight to 0.5% by weight when they are the only micelle-forming surfactant in the solution. However, when using micellar solutions in the methods of the present invention it has been found that the low-k value of the porous materials can be preserved, and yield improved, when the concentration of micelle-forming surfactant(s) (i.e. ignoring cosurfactants) is in the range of from about 0.1 to about 1% by weight. (In a mixed micellar solution it is preferred to have at least 0.1% by weight of each surfactant that contributes to micelle formation). Moreover, even though costs increase when surfactant concentration increases, it can be beneficial to increase the concentration of micelle-forming surfactant(s) up to around 3% by weight (notably in order to ensure complete cleaning of the etched structures).

Accordingly, it is preferred to include micelle-forming surfactant in the micellar solutions of the preferred embodiments of the invention at a concentration within the range of about 0.1 to 3% by weight compared to the total weight of the solution. The concentrations mentioned in this paragraph apply for both aqueous and non-aqueous solutions.

The electrolytes that can be included in the micellar solution so as to contribute counter-ions thereto, lower cmc, or increase the micelle aggregation number include: aromatic counter-ions (e.g. sodium salicylate), monovalent halides (such as bromides, chlorides, fluorides and iodides of ammonium, potassium, and sodium), divalent halides (such as bromides, chlorides, fluorides and iodides of magnesium and calcium), etc. Typically, when such electrolytes are present in the solution they will be present in a total amount that is within the range of about 0.1 to 5% by weight (compared to the total weight of the solution), preferably within the range of about 0.5 to 1%. If micelle size is small, aqueous and non-aqueous micellar solutions used in the techniques of the present invention may use electrolytes in order to increase micelle size (aggregation number), depending upon the surfactant and porous material in question.

The beneficial effects of using a micellar solution according to the present invention for post-etch treatment of a structure in a porous dielectric can be seen from the following results.

Figure 5:
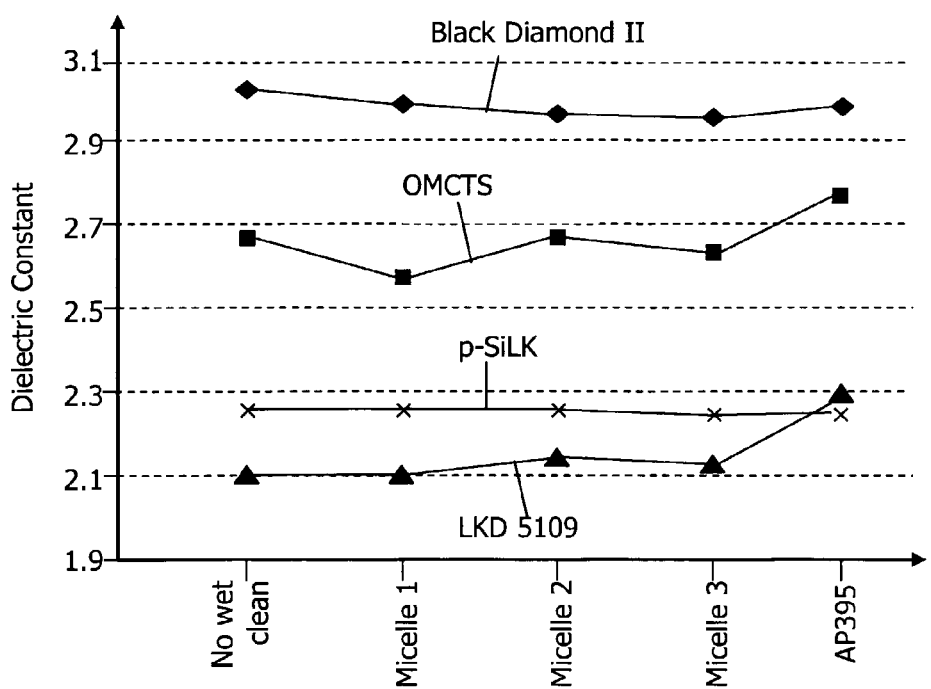
FIG. 5 is a graph showing how the dielectric constant of various low-k dielectric materials changes on cleaning with different cleaning fluids.

Firstly, because the applied micellar solution according to the present invention seals the exposed pores in the porous low-k material, the dielectric constant of that material is substantially unchanged after treatment using the micellar solution, as illustrated in FIG. 5.

FIG. 5 shows the dielectric constant of different porous low-k materials—namely samples of Black Diamond II, octamethylcyclotetrasiloxane (OMCTS), porous SiLK and LKD-5109—which have not been subjected to wet cleaning, as well as the dielectric constant of the same materials after four minutes exposure to the above-mentioned first to third micellar solutions (Micelle 1. Micelle 2 and Micelle 3). For the purposes of comparison, FIG. 5 also shows the dielectric constant of the various porous dielectric materials after treatment using solvent-based cleaning fluid AP395

It can be seen from FIG. 5 that exposure of the porous low-k dielectric materials to the different micellar solutions causes little or no increase in the dielectric constant of the porous material, indicative of pore sealing by micelles. By way of contrast, cleaning with AP395 results in an increase in K due to chemical penetration in the pores.

In addition to sealing the pores in the porous material, the micellar solution can be effective to clean away residues from the etched structure. It is believed that the presence of both a hydrophobic component and a hydrophilic component in the micelles allows them to solubilize a wide variety of different residues, facilitating their removal.

Figure 6:
FIG. 6 is a micrograph showing the presence of post-etch residues in a via etched in a porous low-k dielectric material such as porous SiCOH (or Black Diamond II)
Figure 7:
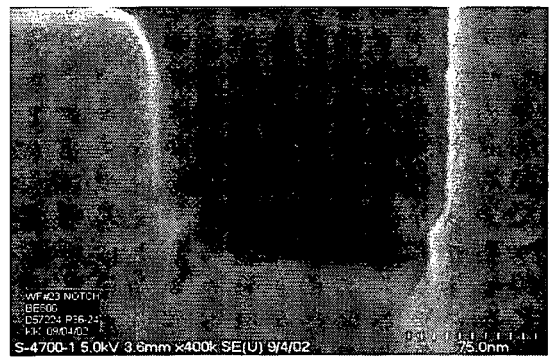
FIG. 7 is a micrograph of the via of FIG. 6 after etching and treatment with a micellar solution according to the present invention.

The efficacy of micellar solutions in removing residues from structures etched in porous low-k dielectrics has been demonstrated in a number of experiments. The effectiveness thereof can be seen from a comparison of the micrograph images of FIGS. 6 and 7 showing a structure etched in a porous low-k dielectric (porous SiCOH, Black Diamond II) before and after cleaning using a micellar solution, respectively.

Use of micellar solutions according to the present invention for post-etch cleaning of structures etched in porous low-k dielectric materials has a beneficial effect on yield, as shall be explained below with reference to FIGS. 8 and 9.

More particularly, experiments have been conducted on various sample wafers to see how via chain yield is affected by the post-etch wet cleaning regime that is applied to the wafer.

These experiments used a batch of patterned short loop wafer samples using Freescale Semiconductor Inc's HiPerMOS 8 (or "HiP8") CMOS platform technology with six-level metal stacks. The wafer samples bore dual inlaid via and trench structures and used copper interconnects with a porous SiCOH (Black Diamond II) low-k dielectric material as interlayer dielectric. Dry etching was used to form vias resulting in exposed underlying copper metal at the bottom. After dry etch, the porous low-k dielectric material was exposed on the surface and via sidewalls for further treatment.

The etched wafer samples were subjected to a number of different cleaning regimes and the via chain yield and via chain resistance were measured at two different locations on the wafers. The tested structures were via arrays with four million via chains. FIGS. 8 and 9 show the measured via chain yield versus via chain resistance for measurements made at the first and second locations, respectively, on the sample wafers. The via chain resistance was evaluated by using class probe analysis to determine the Kelvin contact resistance between conductor levels in the wafers. In accordance with convention, the graphed Kelvin contact resistance corresponds to the resistance value at which 50% of tested wafers have a contact resistance equal to or less than this stated value. The yield value quoted below for a given cleaning regime is the final saturated value (where the yield-resistance curve levels off at the top of the relevant graph).

Figure 8:
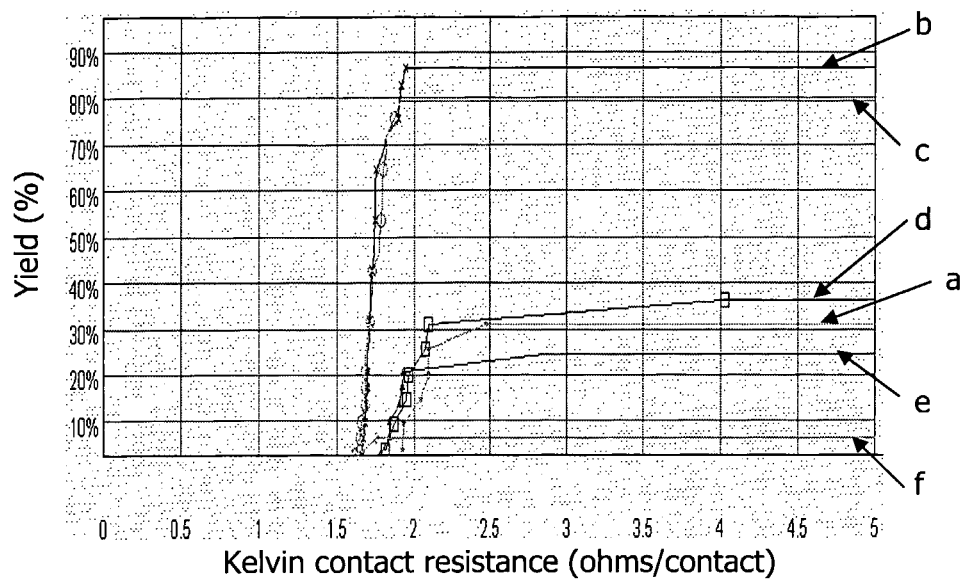
FIG. 8 is a first graph of via chain resistance versus yield for a wafer bearing an array of vias etched in a porous low-k dielectric material such as porous SiCOH (Black Diamond II), after being subjected to different cleaning processes.
Figure 9:
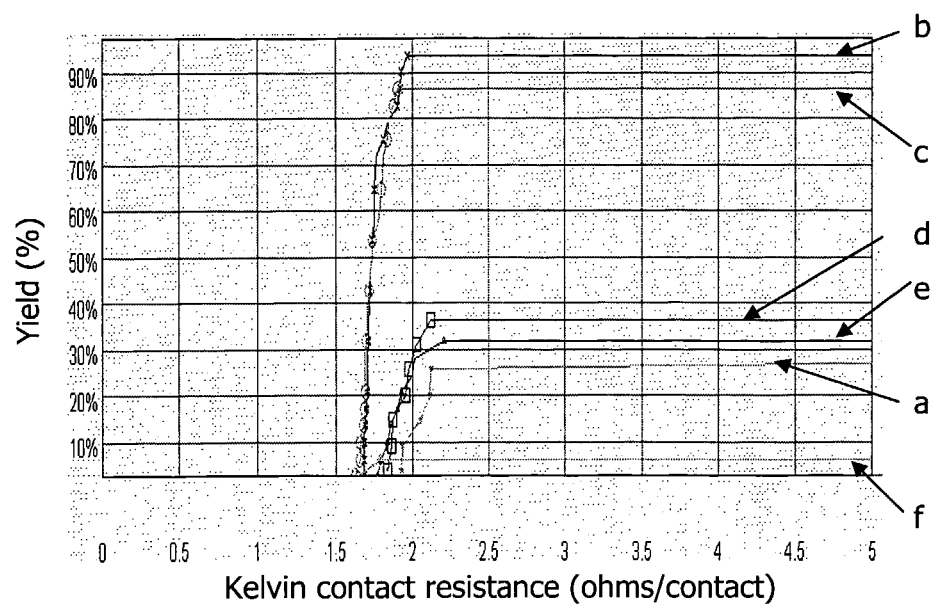
FIG. 9 is a second graph of via chain resistance versus yield for a wafer bearing an array of vias etched in a porous low-k dielectric material, after being subjected to different cleaning processes.

The different cleaning regimes were, as follows:

a) no clean (see results marked in FIGS. 8 and 9 using symbol ∇);

b) wet cleaning using a micellar solution containing a quaternary ammonium type surfactant produced by Ashland, in which the surfactant was present at a concentration of 0.5% by weight (see results marked using the symbol x);

c) wet cleaning using an aqueous micellar solution containing EGMBE at a concentration of 5% by weight (see results marked using the symbol 0);

d) wet cleaning for 80 seconds using a fluorosurfactant-based micellar solution consisting of a 600:1 solution of Zonyl-FSA with dilute HF (see results marked using the symbol □);

e) wet cleaning using a fluorosurfactant-based micellar solution consisting of a solution of Zonyl-FSB (see results marked using the symbol Δ); and f) wet cleaning using an oxalic acid solution that was not a micellar solution (see results marked in FIGS. 8 and 9 using the symbol ◇).

It can be seen from FIGS. 8 and 9 that the via chain yield for those wafers which had not been cleaned after etching was 30% (first measurement location) or 26% (second measurement location). By way of contrast, a greatly-increased via chain yield, 89% and 81.5% at the first measurement location and 96% and 89% at the second measurement location, was obtained when the cleaning regimes b) and c) were applied to the wafers. These cleaning regimes involved use of micellar solutions according to the present invention. A smaller improvement in yield was seen, at least in respect of measurements made at one measurement location, when the cleaning regimes d) and e) were applied to the wafers, using fluorosurfactant-based micellar solutions. By way of contrast, cleaning regime f), a comparative example which used a non-micellar solution of oxalic acid, resulted in a reduction in yield.

It can be seen from the above experimental results that, when cleaning vias etched in porous SiCOH dielectric provided in association with Cu interconnects, micellar solutions using hydrocarbon-based surfactants gave better cleaning performance than micellar solutions based on fluorosurfactants. It is believed that the particular combination of dielectric and metal surfaces that is being treated with micellar solution may affect the degree to which the micelle-forming surfactant can be removed after treatment. If surfactant-removal is poor this can result in lower yield.

More especially, it is considered that particular combinations of metals and dielectric materials may tend to more strongly adsorb certain surfactants, making them more difficult to remove during subsequent rinsing and/or drying. Thus, although substantially all micellar solutions having micelles of suitable dimensions are effective to seal pores of a porous low-k dielectric material exposed in an etched structure, certain micellar solutions will be better than others in removing post-etch residues.

According to preferred embodiments of the present invention, when using micellar solutions both to seal pores in porous low-k dielectric material and to clean away etch residues, it is currently preferred that the micellar solution should be based on one or more surfactants selected in the following group:

the cationic surfactants of the group consisting of: quaternary ammonium halides, quaternary ammonium salts, long chain amines, long chain diamines, long chain polyamines, salts of long chain amines, diamines and polyamines, polyoxyethylenated (or quaternized POE) long-chain amines, and amine oxides;

the anionic surfactants of the group consisting of: carboxylic acids and salts of carboxylic acids, amines and salts of amines, sulfonic acid and sulphuric/phosphoric acid ester and salts, fluorosurfactants;

the non-ionic surfactants of the group consisting of: alkylphenol ethoxylates, carboxylic acid esters, fluorosurfactants, polyoxyethylenated (POE) ethoxylates alcohols/glycols, POE polyoxypropylene glycol, POE mercaptans, alkanolamides, alkylpyrrolidones); and zwitterionic surfactants of the group consisting of: alkyl amino and imino propionic acids, imidazoline carboxylates, alkylbetaines, amines and amine oxides.

As indicated above, it has been found that wet cleaning techniques according to the preferred embodiments of the present invention seal pores in porous low-k dielectric materials, clean away post-etch residues, and improve yield. Moreover, these techniques provide improvements in manufacturability because the cleaning solutions are simple (rather than complex mixtures) and relatively inexpensive, and because no separate pore sealing or post-cleaning annealing steps are required. Moreover, no special equipment is needed in order to apply the micellar cleaning fluids used in the present invention: they can be used in conventional wet clean apparatus.

In particular, according to the present invention an apparatus for sealing pores of a porous low-k dielectric material exposed in an etched structure can be constructed using conventional post-etch wet-cleaning apparatus. One or more wafers bearing a structure etched in a porous low-k material can be loaded into the apparatus in a conventional manner. However, instead of dispensing conventional cleaning chemicals onto the wafer, a micellar solution as described above is provided in the cleaning-chemical dispensing section of the apparatus. The micellar solution can be dispensed onto the wafer using conventional techniques used for dispensing ordinary cleaning chemicals. Typically, the micellar solution will be sprayed (or dispensed) onto the wafer for a period of from about 30 seconds to 2 minutes in a single wafer tool and 3 to 10 minutes in a batch tool. Next, the wafer will be rinsed in water, typically for 30 seconds to 2 minutes in a single wafer tool or from 5 to 10 minutes in a batch tool, then dried. The rinsing and drying steps are substantially the same as those performed in conventional post-etch cleaning processes.

Although the invention has been described with reference to particular preferred embodiments thereof, the skilled person will readily understand that modifications and adaptations can be made in the above-described embodiments without departing from the scope of the invention as defined in the accompanying claims.

In particular, although the above-described examples mention use of micellar solutions based on particular surfactants, the skilled person will readily understand that micellar solutions based on other cationic, non-ionic, anionic, and zwitterionic surfactants (used at concentration higher than cmc) can readily be used to 1) plug the pores in the porous low-k dielectric material and 2) clean the etch residues from the etched structure.

Although the preferred embodiments of the invention have been described in the context of cleaning a structure etched in a porous low-k material, it is to be understood that the same techniques can be applied in a context where the primary objective is to seal pores exposed in an opening formed (by any means) in a porous dielectric material.

In other words, a micellar solution according to the present invention could be applied so as to seal pores at the surfaces of structures etched in a porous low-k dielectric material, but some other cleaning chemistry can be used to remove residues from the etched structure in conjunction with the micellar solution (either by mixing the micelle-forming surfactant with other cleaning chemistry, or by initially applying the micellar solution and then applying the cleaning chemistry in a separate follow-up step).

Although this approach is less efficient than using a single micellar solution both to seal pores and to clean away etch residues, it may be appropriate in some cases, notably in a case where the particular combination of dielectric materials and metals in the etched structure is such that a given micellar solution has lower cleaning performance and an additional micellar or chemical cleaning fluid is required. In such cases, micelles will plug the pores and aid in cleaning the post-etch residues in conjunction with the added or follow-up chemistry.

Micellar solution can be formed within other chemistries by addition of surfactant at concentration higher than cmc. For example, the surfactant at concentration higher than its cmc could be combined with dilute HF, with organic carboxylic acids (such as acetic, citric, oxalic, glycolic, malic, salicyclic, tartaric, terephthalic acid, and others), with amines (such as MEA, DEA, MDEA, and others) etc. In such cases, the micelles 1) plug the pores and prevent penetration of chemicals into the pores and 2) aid in cleaning the etch residues in conjunction with the other chemistry.

The invention claimed is:

1. A method of sealing pores of a porous dielectric material exposed at a surface of an etched structure, the method comprising:
   applying to said etched structure a micellar solution comprising micelles of diameter equal to or greater than about 1.5 times the diameter of the pores in said porous dielectric material, the micelles to seal pores of the porous material and limit ingress of water into the pores.

2. The processing method of claim 1, wherein said etched structure is formed in a porous dielectric material having a bulk dielectric constant equal to or less than about 3.0.

3. The processing method of claim 2, wherein the micellar solution comprises one or more surfactants present at a concentration higher than the respective critical micelle concentration thereof, said one or more surfactants being selected in the group consisting of:
   the cationic surfactants of the group consisting of: quaternary ammonium halides, quaternary ammonium salts, long chain amines, long chain diamines, long chain polyamines, salts of long chain amines, diamines and polyamines, polyoxyethylenated (or quaternized POE) long-chain amines, and amine oxides;
   the anionic surfactants of the group consisting of: carboxylic acids and salts of carboxylic acids, amines and salts of amines, sulfonic acid and sulphuric/phosphoric acid ester and salts, fluorosurfactants;
   the non-ionic surfactants of the group consisting of: alkylphenol ethoxylates, carboxylic acid esters, fluorosurfactants, polyoxyethylenated (POE) ethoxylates alcohols/glycols, POE polyoxypropylene glycol, POE mercaptans, alkanolamides, alkylpyrrolidones); and
   zwitterionic surfactants of the group consisting of: alkyl amino and imino propionic acids, imidazoline carboxylates, alkylbetaines, amines and amine oxides.

4. A processing method according to claim 2, wherein the micellar solution comprises one or more surfactants present at a concentration higher than the respective critical micelle concentration thereof, and a total amount of said one or more surfactants present in the micellar solution is about 0.05 to about 5.0% by weight compared to the total weight of the solution.

5. A processing method according to claim 2, wherein the micellar solution is applied to the etched surface using post-etch wet cleaning apparatus having a micellar solution in the cleaning-fluid dispensing section thereof.

6. The processing method of claim 1, wherein the micellar solution comprises one or more surfactants present at a concentration higher than the respective critical micelle concentration thereof, said one or more surfactants being selected in the group consisting of:
   the cationic surfactants of the group consisting of: quaternary ammonium halides, quaternary ammonium salts, long chain amines, long chain diamines, long chain polyamines, salts of long chain amines, diamines and polyamines, polyoxyethylenated (or quaternized POE) long-chain amines, and amine oxides;

the anionic surfactants of the group consisting of: carboxylic acids and salts of carboxylic acids, amines and salts of amines, sulfonic acid and sulphuric/phosphoric acid ester and salts, fluorosurfactants;

the non-ionic surfactants of the group consisting of: alkylphenol ethoxylates, carboxylic acid esters, fluorosurfactants, polyoxyethylenated (POE) ethoxylates alcohols/glycols, POE polyoxypropylene glycol, POE mercaptans, alkanolamides, alkylpyrrolidones); and zwitterionic surfactants of the group consisting of: alkyl amino and imino propionic acids, imidazoline carboxylates, alkylbetaines, amines and amine oxides.

7. A processing method according to claim 6, wherein the total amount of said one or more surfactants present in the micellar solution is about 0.1 to about 3.0% by weight compared to the total weight of the solution.

8. A processing method according to claim 6, wherein the micellar solution comprises one or more surfactants present at a concentration higher than the respective critical micelle concentration thereof, and a total amount of said one or more surfactants present in the micellar solution is about 0.05 to about 5.0% by weight compared to the total weight of the solution.

9. A processing method according to claim 6, wherein the micellar solution is applied to the etched surface using post-etch wet cleaning apparatus having a micellar solution in the cleaning-fluid dispensing section thereof.

10. A processing method according to claim 1, wherein the micellar solution comprises one or more surfactants present at a concentration higher than the respective critical micelle concentration thereof, and a total amount of said one or more surfactants present in the micellar solution is about 0.05 to about 5.0% by weight compared to the total weight of the solution.

11. A processing method according to claim 10, wherein the micellar solution is applied to the etched surface using post-etch wet cleaning apparatus having a micellar solution in the cleaning-fluid dispensing section thereof.

12. A processing method according to claim 1, wherein the micellar solution is applied to the etched surface using post-etch wet cleaning apparatus having a micellar solution in the cleaning-fluid dispensing section thereof.

13. The method of claim 1, whereby the micelles block the pores at the surface, limiting ingress of water.

14. A method of manufacturing a semiconductor device, comprising the steps of:

forming a layer of porous dielectric material at at least one level on a semiconductor wafer;

etching at least one structure whereby to expose pores of said porous dielectric material at a surface or sidewall of the etched structure; and applying to said at least one structure a micellar solution comprising micelles of diameter equal to or greater than about 1.5 times the diameter of the pores of said porous dielectric material, the micelles to seal the exposed pores of said porous dielectric material.

15. The method of claim 14, wherein said porous dielectric material is a material having a bulk dielectric constant equal to or less than about 3.0.

16. A semiconductor device manufacturing method according to claim 15, wherein the micellar solution comprises one or more surfactants present at a concentration higher than the respective critical micelle concentration thereof, and a total amount of said one or more surfactants present in the micellar solution is about 0.05 to about 5.0% by weight compared to the total weight of the solution.

17. The semiconductor device manufacturing method of claim 14, wherein the micellar solution comprises one or more surfactants present at a concentration higher than the respective critical micelle concentration thereof, said one or more surfactants being selected in the group consisting of:

the cationic surfactants of the group consisting of: quaternary ammonium halides, quaternary ammonium salts, long chain amines, long chain diamines, long chain polyamines, salts of long chain amines, diamines and polyamines, polyoxyethylenated (or quaternized POE) long-chain amines, and amine oxides;

the anionic surfactants of the group consisting of: carboxylic acids and salts of carboxylic acids, amines and salts of amines, sulfonic acid and sulphuric/phosphoric acid ester and salts, fluorosurfactants;

the non-ionic surfactants of the group consisting of: alkylphenol ethoxylates, carboxylic acid esters, fluorosurfactants, polyoxyethylenated (POE) ethoxylates alcohols/glycols, POE polyoxypropylene glycol, POE mercaptans, alkanolamides, alkylpyrrolidones; and zwitterionic surfactants of the group consisting of: alkyl amino and imino propionic acids, imidazoline carboxylates, alkylbetaines, amines and amine oxides.

18. A semiconductor device manufacturing method according to claim 17, wherein a total amount of said one or more surfactants present in the micellar solution is about 0.1 to about 3.0% by weight compared to the total weight of the solution.

19. A semiconductor device manufacturing method according to claim 17, wherein the micellar solution comprises one or more surfactants present at a concentration higher than the respective critical micelle concentration thereof, and a total amount of said one or more surfactants present in the micellar solution is about 0.05 to about 5.0% by weight compared to the total weight of the solution.

20. A semiconductor device manufacturing method according to claim 14, wherein the micellar solution comprises one or more surfactants present at a concentration higher than the respective critical micelle concentration thereof, and a total amount of said one or more surfactants present in the micellar solution is about 0.05 to about 5.0% by weight compared to the total weight of the solution.

* * * * *